(12) United States Patent
Lee

(10) Patent No.: US 6,961,241 B2
(45) Date of Patent: Nov. 1, 2005

(54) ELECTRONIC APPARATUS WITH NATURAL CONVECTION STRUCTURE

(75) Inventor: Kuo-Liang Lee, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 0 days.

(21) Appl. No.: 10/661,676

(22) Filed: Sep. 15, 2003

(65) Prior Publication Data

US 2004/0257778 A1 Dec. 23, 2004

(30) Foreign Application Priority Data

Jun. 18, 2003 (TW) .................................. 92116586 A

(51) Int. Cl.$^7$ .................................................. H05K 7/20
(52) U.S. Cl. ..................... 361/692; 361/688; 361/690; 361/694; 361/714; 361/715
(58) Field of Search .................... 361/688, 690, 361/692, 694–695, 714, 715, 683, 686, 687, 728, 752; 174/52.1, 60; 454/184; 165/80.3

(56) References Cited

U.S. PATENT DOCUMENTS

| 5,592,366 | A | * | 1/1997 | Goldman et al. | ............ 361/796 |
| 6,144,556 | A | * | 11/2000 | Lanclos | ............... 361/695 |
| 6,430,044 | B2 | * | 8/2002 | Hutchinson et al. | ........ 361/690 |
| 6,459,577 | B1 | * | 10/2002 | Holmes et al. | ............. 361/690 |
| 6,535,382 | B2 | * | 3/2003 | Bishop et al. | .............. 361/690 |
| 6,650,539 | B1 | * | 11/2003 | Lin et al. | ................... 361/690 |

* cited by examiner

Primary Examiner—Phuong T. Vu
(74) Attorney, Agent, or Firm—Bacon & Thomas, PLLC

(57) ABSTRACT

An electronic apparatus with enhanced natural convection structure. The electronic apparatus with natural convection structure includes a casing structure, a first hole passing through the casing structure from the top surface to the bottom surface of the casing structure, a first printed circuit board disposed adjacent to one side of the first hole in the casing structure and substantially parallel to the first hole, and a supporting device disposed on the bottom surface of the casing structure. Via the specific height of the supporting device, the airflow under and near the bottom surface of the casing can flow through the hole to achieve the purpose of dissipating the heat of the electronic apparatus.

10 Claims, 3 Drawing Sheets

ELECTRONIC APPARATUS WITH NATURAL CONVECTION STRUCTURE

FIELD OF THE INVENTION

A DeskNote computer is also known as a notebook computer.

This invention relates to an electronic apparatus, and more particularly to an electronic apparatus with natural convection structure.

BACKGROUND OF THE INVENTION

The adapter and the power supply are electronic apparatuses used frequently in our daily life. Taking the adapter as an example, generally speaking, a common adapter is installed in the casing structure of the main frame of the personal computer to provide enough power for the computer, so that the computer can operate normally.

However, with the demand of consumers and the developing trend of the electronic products, desktop personal computers are gradually eliminated and replaced with notebook computers that are popular in the present computer market. Because the volume of the notebook computer is limited, many types of equipment, such as disk, can not be installed in the main frame of the notebook computer. As a result, a DeskNote computer whose volume is between the desktop personal computer and the notebook computer has been gradually developed. The innovative DeskNote computer has a proper volume which on the one hand many types of equipment can be installed in, and on the other hand can cater to the demand of the convenience for carrying. Certainly, this innovative DeskNote computer has different electronic apparatuses from the conventional electronic apparatuses of the desktop personal computers or notebook computer. Take a DeskNote computer's power supply for example, the power supply for a DeskNote computer is removed out of the casing structure of the main frame of the computer to be an independent electronic apparatus, and the volume of the DeskNote computer's power supply is between the volume of the desktop computer's and the notebook computer's.

Generally speaking, when the power supply is installed in the casing structure of the main frame of the personal desktop computer, fans are usually installed in harmony with the power supply to help dissipate the heat. However, when the power supply is removed out of the casing structure of the main frame of the computer, the heat-dissipating problem of the power supply becomes a key point which decides whether the computer can operate normally or not. Please refer to FIG. 1, which shows a diagram of a power supply for a DeskNote. As shown in FIG. 1, the power supply comprises a main body 11, a power output terminal 12, and a power connection terminal 13. Usually, the power output terminal 12 and power connection terminal 13 locate at the two relative sides of the main body 11, and a printed circuit board is disposed in the main body 11 (not shown). With the integration of the integrated circuit and the volume-reduced trend of the power supply, when the power supply is operated, an extremely high heat will be generated from the electronic elements on the printed circuit board (not shown) in the interior of the main body 11. When the heat which is generated from the power supply accumulates within the interior of the main body 11 and could not dissipate, the power supply will not continue to operate normally and further affect the operation of the DeskNote computer. What more important, if the heat accumulated within the adapter cannot be dissipated efficiently, the electronic elements in the adapter will be damaged easily, and thus, not only the lifespan of the power supply will be decreased but also the frequency of the breakdown of the DeskNote computer will be increased.

Therefore, to overcome the disadvantages of the prior art described above, it is needed to provide a heat-dissipating casing of an electronic apparatus which has effects of heat-dissipation, temperature-equalization and scald-prevention.

SUMMARY OF THE INVENTION

The object of the present invention is to provide an electronic apparatus with natural convection structure wherein the warm air under and near the electronic apparatus flows upward through the passing hole by a specific height of a supporting device to achieve the purpose of dissipating the heat of the electronic apparatus, to improve the heat-dissipating problem of the conventional electronic apparatus, and to equalize the interior and exterior temperature of the electronic apparatus.

In order to achieve the above-mentioned object, there is provided an electronic apparatus with natural convection structure, comprising: at least a casing structure, the casing structure having a first hole passing through the casing structure from a top surface to a bottom surface thereof; a first printed circuit board disposed adjacent to one side of the first hole in the casing structure and substantially parallel to the side of the first hole; and at least a supporting device disposed on the bottom surface of the casing structure.

In accordance with another aspect of the present invention, the electronic apparatus is an external Power supply for a DeskNote computer.

In accordance with another aspect of the present invention, the electronic apparatus with natural convection structure further comprises a second printed circuit board disposed adjacent to the other side of the first hole in the casing structure and substantially parallel to the other side of the first hole.

In accordance with another aspect of the present invention, the electronic apparatus with natural convection structure further comprises a second hole passing through the relative sides of the casing structure, communicating with the first hole, and being vertical to the first hole and substantially parallel to the first printed circuit board.

In accordance with another aspect of the present invention, the supporting device has a specific height, and the specific height is substantially at least 3 mm.

In accordance with another aspect of the present invention, the supporting device is extended outward a specific width from the sidewalls of the casing structure, and the specific width is substantially at least 3 mm.

In accordance with another aspect of the present invention, the distances from the first hole to the edges of the casing structure are substantially equal.

In accordance with another aspect of the present invention, the casing structure and the first hole are integrally formed.

In accordance with another aspect of the present invention, the vertical and horizontal cross-sections of the first hole are rectangular.

In accordance with another aspect of the present invention, the electronic apparatus with natural convection structure further comprises an input device. Preferably, the input device is one selected from a group consisting of a plug, a socket, and a power cord.

In accordance with another aspect of the present invention, the electronic apparatus with natural convection structure further comprises an output device. Preferably, the output device is one selected form a group consisting of a plug, a socket, and a power cord.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

The present invention relates to an electronic apparatus with natural convection structure. The present techniques are illustrated with the following embodiments for a Power supply for a DeskNote, but the electronic apparatus which is applied in the present techniques is not limited to the DeskNote. Any electronic apparatus which is applicable to the following techniques, such as an adapter, a charger and a transformer, is incorporated herein for reference.

The power supply of the present invention mainly includes a casing structure, a first hole, a first printed circuit board, and at least a supporting device. In an embodiment of the present invention, the power supply further comprises an input device and output device, wherein the input device can be one selected from a group consisting of a plug, a socket, and a power cord, and the output device can also be one selected from a group consisting of a plug, a socket and a power cord. For the convenience of description, the following embodiments are illustrated with a power supply having a socket as the input device and a power cord as the output device, in which the socket can be connected to a plug of a power cord for inputting the commercially available power, and the power supply can output the converted power to an information equipment, such as a DeskNote computer, via the output device of the power cord.

Figure 1:
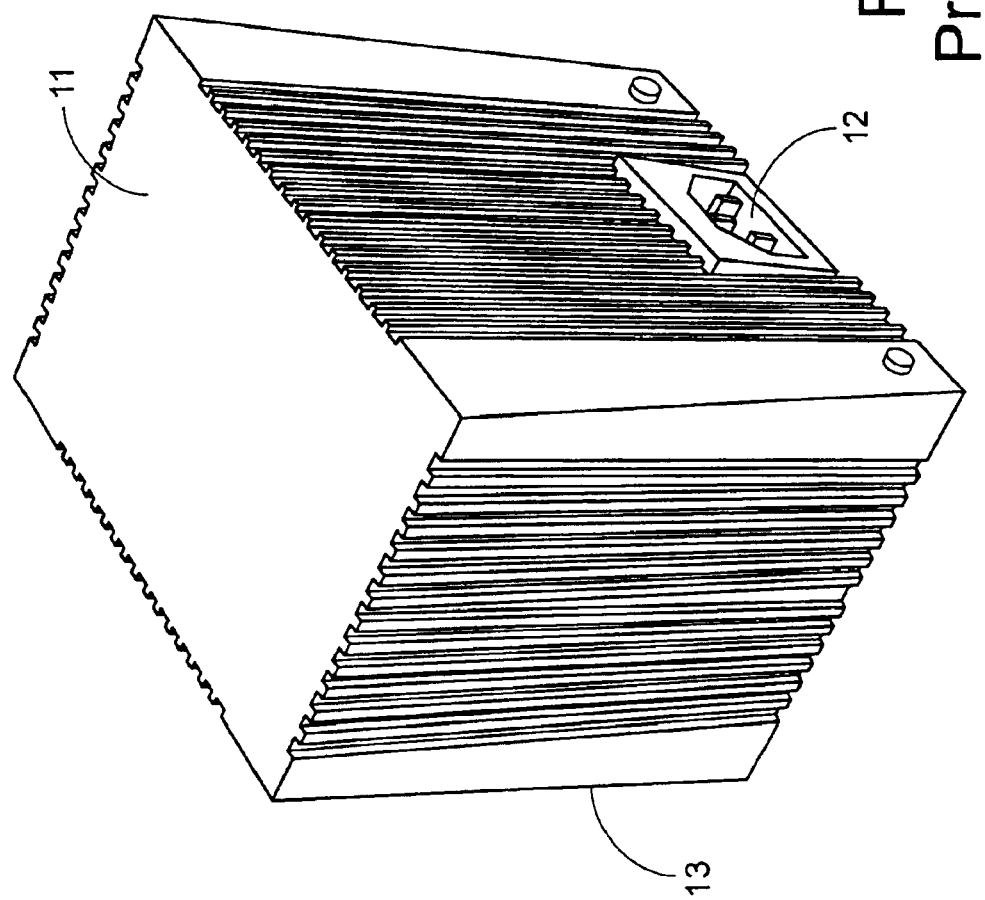
FIG. 1 is a schematic view showing a conventional power supply for a DeskNote.
Figure 2:
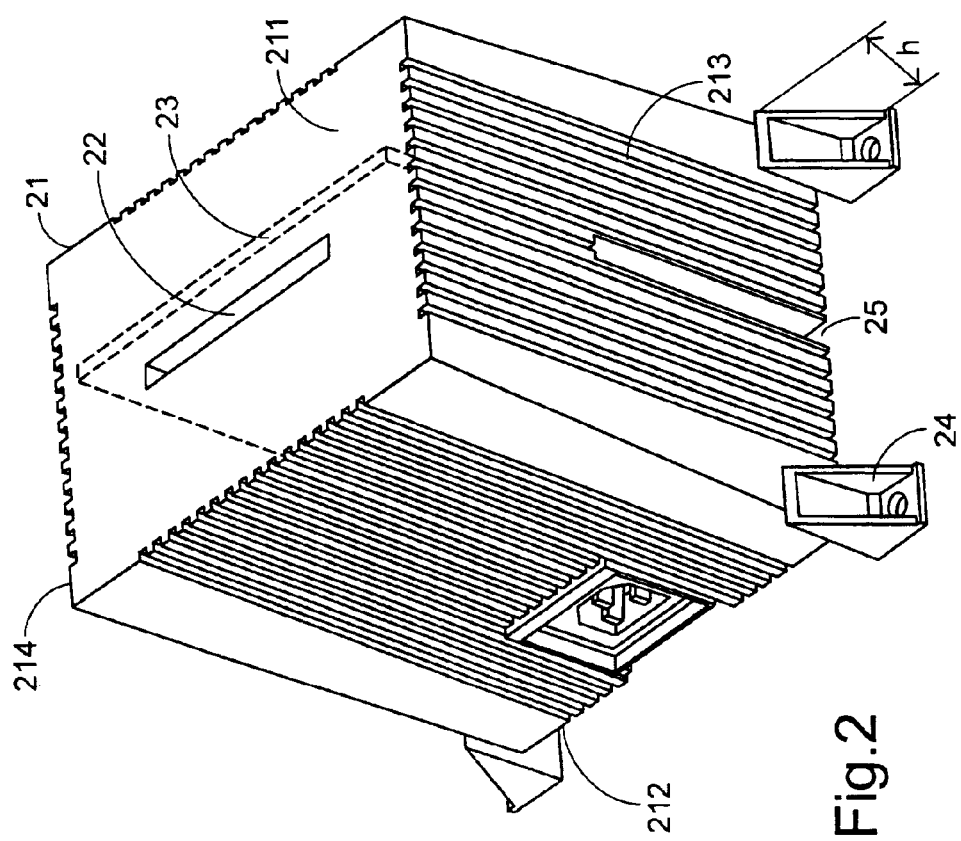
FIG. 2 is a schematic view showing the outer structure of the preferred embodiment of the present invention.
Figure 3:
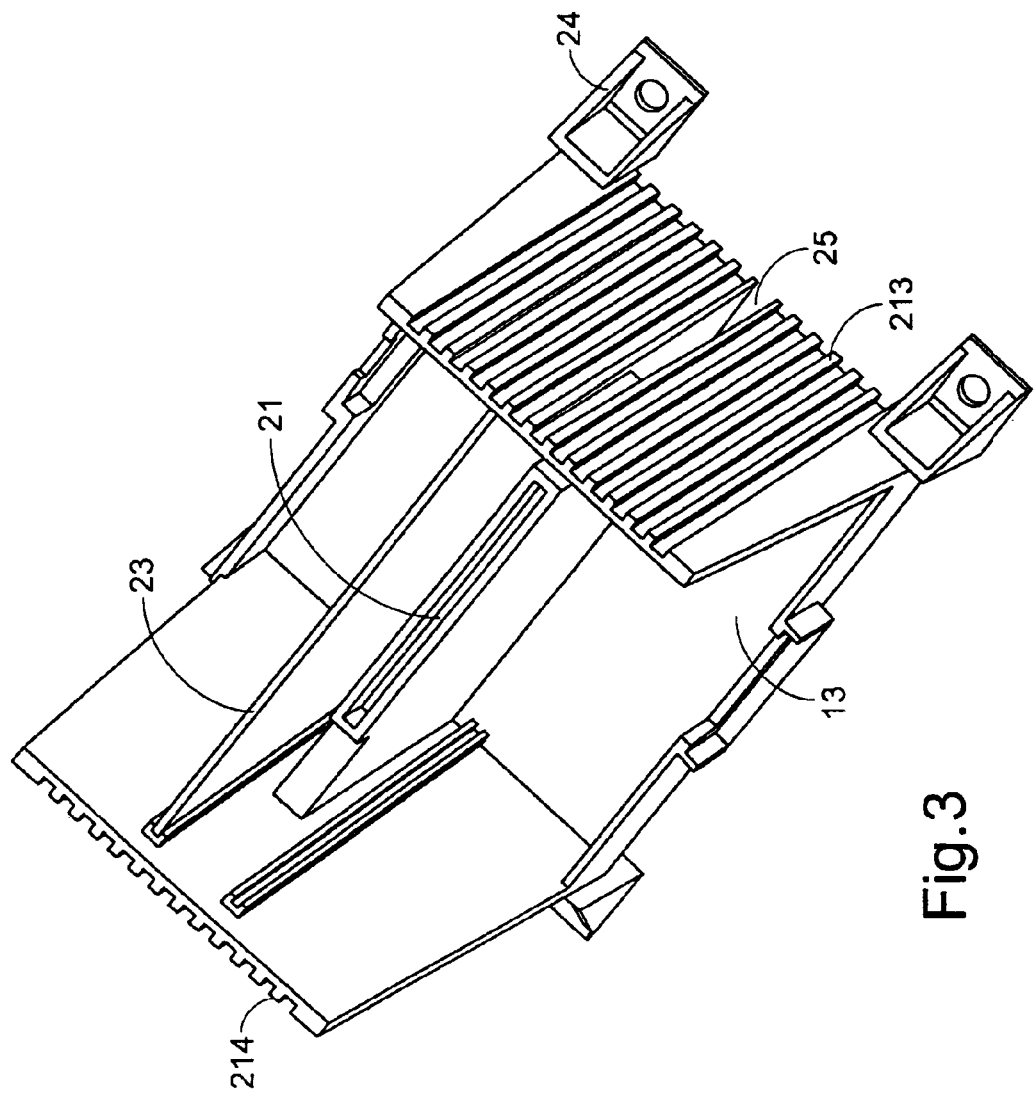
FIG. 3 is a schematic view showing the inner structure of the preferred embodiment of the FIG. 2.

Please refer to FIG. 2 and FIG. 3, wherein the FIG. 2 is a schematic diagram showing the outer structure of the preferred embodiment of the present invention and the FIG. 3 is a schematic diagram showing the inner structure of the preferred embodiment of the FIG. 2. As shown in FIG. 2 and FIG. 3, the electronic apparatus with natural convection structure includes a casing structure 21, a first hole 22, a first printed circuit board 23, and at least a supporting device 24, wherein the first hole 22 passes through the casing structure 21 from a top surface 211 to a bottom surface 212. The first printed circuit board 23 is disposed adjacent to one side of the first hole 22 in the casing structure 21 and substantially parallel to the side of the first hole 22. The supporting device 24 is disposed on the bottom surface 212 of the casing structure 21 and has a specific height h, in which the specific height h is varied with the dimension of the electronic apparatus. The specific height h is at least 3 mm to form a space for natural air convection between the bottom of the electronic apparatus and the contact surface of an article, such as a desk or table.

The electronic apparatus is usually placed on a desk or a ground. When the electronic apparatus is used, the temperature of the first printed circuit board 23 which is in the interior of the casing structure 21 gradually increases, and the heat generated from the first printed circuit board 23 will be gradually transferred to the surface of the electronic apparatus by conduction or radiation. In the meantime, the air near the bottom surface 212 of the electronic apparatus is heated and the temperature increases due to the increasing temperature of the first printed circuit board 23. Since the supporting device 24 which is attached to the bottom surface 212 of the casing structure 21 has a specific height h, there is a specific distance between the bottom of the electronic apparatus and the contact surface of the desk or ground. While the temperature of the air near the bottom surface 212 of the casing structure 21 increases, the density of the air decreases. As a result, the heated air will start to flow up, and then is dissipated upwardly through the first hole 22 from the bottom surface 212 of the casing structure 21, so that the surrounding cool air will fill the space left by the up-flowing warm air, thereby forming a upward heat-dissipating airflow to remove the heat generated during the operation period of the electronic apparatus. By the upward heat-dissipating airflow, the heat in the surface of the electronic apparatus is easily to be dissipated and the temperature of the surface of the electronic apparatus decreases. Therefore, the electronic apparatus of the present invention has a better heat-dissipating effect. Moreover, the first hole 22 is a passing structure, which results in the increase of the surface area of the electronic apparatus as well as the total heat-dissipating area, so that the heat-dissipating effect of the electronic apparatus can be reinforced. Certainly, in the embodiment of the present invention, the interior of the casing structure 21 can further comprise a second printed circuit board (not shown) disposed adjacent to the other side of the first hole 22 and relatively parallel to the first printed circuit board 23. When the electronic apparatus is used, the heat-dissipating airflow generated from the first hole 22 can also bring out the heat generated from the first printed circuit board 23 and the second printed circuit board (not shown).

Besides, in order to prevent the condition which the natural air convection space can not be provided when the power supply is accidentally turned over, the electronic apparatus of the present invention further comprises a second hole 25 passing through the relative sidewalls 213, 214 of the casing structure 21, communicating with the first hole 22, and being substantially vertical to the first hole 22. Thereby, when the electronic apparatus of the present invention is turned over or inclined, the natural air convection space can also be provided through the specific width of the supporting device 24 extended outward from the sidewall 213 of the casing structure 21 in which the specific width is substantially at least 3 mm. As a result, the problem of unable heat-dissipation caused by turning over or inclining the electronic apparatus can be prevented.

Certainly, the number of the printed circuit board that is capable of being disposed in the electronic apparatus of the present invention is not limited, and the number, size and shape of the hole are not limited. Usually, for improving the heat-dissipating effect, a preferred location of the first hole and/or the second hole is at the center of the main body of the electronic apparatus, so that the distances from the first hole and/or the second hole to the edges of the main body are substantially equal and thus the heat-dissipation of the electronic apparatus is more even. Alternatively, the location near the major heat-generating source of the printed circuit board is another preferred location of the hole. Generally speaking, for the convenience of the manufacturing process, the first hole and/or the second hole is often integrally formed with the casing structure of the electronic apparatus and the shape of the first hole and/or the second hole is often designed as a rectangle according to the shape of the circuit board. The shape of the first hole and/or the second hole can be other different shapes depend on the location that the circuit board disposed in the interior of the electronic apparatus.

In conclusion, the electronic apparatus of the present invention has a first hole which passes through the casing structure, and/or a second hole which can similarly provide a natural air convection space when the electronic apparatus is turned over or inclined. Besides, the supporting device is disposed on the bottom of the electronic apparatus and has a specific height, so that the warm air at the bottom of the electronic apparatus can flow up along the first hole and/or the second hole and the surrounding cool air will fill the space. Therefore, a cyclic airflow is formed to reinforce a heat convection effect at the surface of the electronic apparatus. In addition, the first hole and/or the second hole can increase the surface area of the electronic apparatus as well as the total heat-dissipating area. As a result, the present invention overcomes the disadvantage of poor heat-dissipation of the prior art, and improve the heat-dissipating effect of the electronic apparatus. Moreover, with respect to the manufacturing aspect, the first hole and/or the second hole and the casing structure of the electronic apparatus are integrally formed, so the manufacturing cost and time will not increase. Thus, the present invention possesses high industrial value.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An electronic apparatus with natural convection structure, comprising:

a casing structure, said casing structure having a first hole passing through said casing structure from a top surface thereof to a bottom surface thereof, and a second hole passing through relative sides of said casing structure, said second hole communicating with said first hole and being vertical to said first hole and substantially parallel to a first printed circuit board;

said first printed circuit board is vertically disposed adjacent to one side of said first hole in the casing structure and substantially parallel to said side of said first hole; and at least a supporting device disposed on said bottom surface of said casing structure.

2. The electronic apparatus according to claim 1, wherein said electronic apparatus is an external power supply for a notebook computer.

3. The electronic apparatus according to claim 1, further comprising a second printed circuit board disposed adjacent to another side of said first hole in the casing structure and substantially parallel to said another side of said first hole.

4. The electronic apparatus according to claim 1, wherein said supporting device has a specific height, and said specific height is substantially at least 3 mm.

5. The electronic apparatus according to claim 1, wherein said supporting device is extended outward a specific width from at least one side of said casing structure, and said specific width is substantially at least 3 mm.

6. The electronic apparatus according to claim 1, wherein distances from said first hole to edges of said casing structure are substantially equal.

7. The electronic apparatus according to claim 1, wherein said casing structure and said first hole are integrally formed.

8. The electronic apparatus according to claim 1, wherein vertical and horizontal cross-sections of said first hole are rectangular.

9. The electronic apparatus according to claim 1, further comprising an input device, and said input device is selected from the group consisting of a plug, a socket, and a power cord.

10. The electronic apparatus according to claim 1, further comprising an output device, and said output device is selected from the group consisting of a plug, a socket, and a power cord.

* * * * *